(12) United States Patent
Ripley et al.

(10) Patent No.: US 7,696,826 B2
(45) Date of Patent: Apr. 13, 2010

(54) TEMPERATURE COMPENSATION OF COLLECTOR-VOLTAGE CONTROL RF AMPLIFIERS

(75) Inventors: David S. Ripley, Cedar Rapids, IA (US); Kerry Brent Phillips, Haverhill, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 496 days.

(21) Appl. No.: 11/634,342

(22) Filed: Dec. 4, 2006

(65) Prior Publication Data

US 2009/0115520 A1 May 7, 2009

(51) Int. Cl.
*H03F 3/04* (2006.01)
(52) U.S. Cl. ...................... 330/289; 330/297
(58) Field of Classification Search .............. 330/289, 330/296, 133, 297, 285
See application file for complete search history.

(56) References Cited

U.S. PATENT DOCUMENTS

| 3,470,472 | A | 9/1969 | Suzuki |
|---|---|---|---|
| 3,706,933 | A | 12/1972 | Bidell et al. |
| 4,068,159 | A | 1/1978 | Gyugyi |
| 4,137,776 | A | 2/1979 | Rudis et al. |
| 4,162,452 | A | 7/1979 | Ash |
| 4,245,165 | A | 1/1981 | Hoffman |
| 4,292,596 | A | 9/1981 | Ishizuka et al. |
| 4,438,411 | A | 3/1984 | Rubin et al. |
| 4,501,018 | A | 2/1985 | Shanley |
| 4,596,143 | A | 6/1986 | Norel |
| 4,641,048 | A | 2/1987 | Pollock |
| 4,758,802 | A | 7/1988 | Jackson |
| 4,866,314 | A | 9/1989 | Traa |
| 4,885,550 | A | 12/1989 | Ferrer |
| 4,980,586 | A | 12/1990 | Sullivan et al. |
| 4,987,606 | A | 1/1991 | Ozeki et al. |
| 5,047,664 | A | 9/1991 | Moyal |
| 5,055,800 | A | 10/1991 | Black et al. |

(Continued)

FOREIGN PATENT DOCUMENTS

DE  196 23 930  12/1997

(Continued)

OTHER PUBLICATIONS

Sedra, Adel S., et al. Microelectronic Circuits, Hot Rine-Hart and Winston, p. 262 (ISBN 0-03-007328-6), 1987.

(Continued)

*Primary Examiner*—Robert Pascal
*Assistant Examiner*—Hieu P Nguyen
(74) *Attorney, Agent, or Firm*—Weide & Miller, Ltd.

(57) ABSTRACT

A temperature compensation system for compensating a collector-voltage controlled RF amplifier. To overcome variation that occurs with temperature which can result in signal degradation of the adjacent channel spectrum, a temperature compensated current is utilized to create an offset signal. The offset signal is processed in connection with a control or data signal to generate a temperature compensated voltage source control signal. A differential amplifier may process the data or control signal and the offset signal. The compensated voltage control signal tracks temperature to adapt the applied collector voltage to temperature. This in turn forces the applied collector voltage to vary in response to temperature changes thereby maintaining a constant output power or RF swing. One example environment of use is in an EDGE type GSM system.

19 Claims, 9 Drawing Sheets

U.S. PATENT DOCUMENTS

| | | | |
|---|---|---|---|
| 5,095,542 A | 3/1992 | Suematsu et al. | |
| 5,111,162 A | 5/1992 | Hietala et al. | |
| 5,166,959 A | 11/1992 | Chu et al. | |
| 5,179,353 A | 1/1993 | Miyake | |
| 5,264,745 A | 11/1993 | Woo | |
| 5,303,258 A | 4/1994 | Nakamura | |
| 5,321,851 A | 6/1994 | Sugayama et al. | |
| 5,327,131 A | 7/1994 | Ueno et al. | |
| 5,365,190 A | 11/1994 | Yu et al. | |
| 5,438,259 A | 8/1995 | Orihashi et al. | |
| 5,444,863 A | 8/1995 | Torii | |
| 5,450,030 A | 9/1995 | Shin et al. | |
| 5,450,044 A | 9/1995 | Hulick | |
| 5,457,719 A | 10/1995 | Guo et al. | |
| 5,534,827 A | 7/1996 | Yamaji | |
| 5,553,319 A | 9/1996 | Tanbakuchi | |
| 5,578,943 A | 11/1996 | Sasaki | |
| 5,578,944 A | 11/1996 | Sasaki | |
| 5,596,600 A | 1/1997 | Dimos et al. | |
| 5,603,096 A | 2/1997 | Gilhousen et al. | |
| 5,627,499 A | 5/1997 | Gardner | |
| 5,631,601 A | 5/1997 | Horsfall et al. | |
| 5,640,692 A | 6/1997 | Bothorel | |
| 5,648,985 A | 7/1997 | Bjerede et al. | |
| 5,661,434 A | 8/1997 | Brozovich et al. | |
| 5,672,960 A | 9/1997 | Manaresi et al. | |
| 5,701,594 A | 12/1997 | Bath | |
| 5,758,269 A | 5/1998 | Wu | |
| 5,838,210 A | 11/1998 | Midya et al. | |
| 5,859,869 A | 1/1999 | Sanderford | |
| 5,903,194 A | 5/1999 | Opsahl et al. | |
| 5,942,938 A | 8/1999 | Myers | |
| 6,023,185 A | 2/2000 | Galipeau et al. | |
| 6,052,032 A | 4/2000 | Järvinen | |
| 6,101,224 A | 8/2000 | Lindoffi | |
| 6,108,527 A | 8/2000 | Urban et al. | |
| 6,114,910 A | 9/2000 | Goff | |
| 6,121,758 A | 9/2000 | Bellina et al. | |
| 6,130,579 A | 10/2000 | Iyer et al. | |
| 6,172,567 B1 | 1/2001 | Ueno et al. | |
| 6,194,963 B1 | 2/2001 | Camp | |
| 6,204,650 B1 | 3/2001 | Shimamori et al. | |
| 6,222,878 B1 | 4/2001 | McCallister et al. | |
| 6,233,440 B1 | 5/2001 | Taylor | |
| 6,256,482 B1 | 7/2001 | Raab | |
| 6,297,685 B1 | 10/2001 | Ewen et al. | |
| 6,300,837 B1 | 10/2001 | Sowlati et al. | |
| 6,313,705 B1 | 11/2001 | Dening et al. | |
| 6,333,677 B1 | 12/2001 | Dening | |
| 6,421,398 B1 | 7/2002 | McVey | |
| 6,445,247 B1 | 9/2002 | Walker | |
| 6,452,454 B1 | 9/2002 | Shapiro et al. | |
| 6,492,875 B2 | 12/2002 | Luo et al. | |
| 6,496,061 B1 | 12/2002 | Bloom et al. | |
| 6,510,309 B1 | 1/2003 | Thompson et al. | |
| 6,535,735 B2 | 3/2003 | Underbrink et al. | |
| 6,651,021 B2 | 11/2003 | Underbrink et al. | |
| 6,681,101 B1 | 1/2004 | Eidson et al. | |
| 6,763,228 B2 | 7/2004 | Prentice et al. | |
| 6,771,128 B1 | 8/2004 | Yamashita et al. | |
| 6,819,182 B2 | 11/2004 | Sibrai | |
| 6,873,208 B2 | 3/2005 | Shinjo et al. | |
| 6,873,211 B1 | 3/2005 | Thompson et al. | |
| 6,930,538 B2 * | 8/2005 | Chatal | 327/539 |
| 6,996,191 B1 | 2/2006 | Meditz | |
| 7,256,653 B2 * | 8/2007 | Maya et al. | 330/289 |
| 2004/0142674 A1 | 7/2004 | Kuiri | |

FOREIGN PATENT DOCUMENTS

| | | |
|---|---|---|
| EP | 0800267 | 3/1991 |
| EP | 0597653 | 5/1994 |
| EP | 0624004 | 11/1994 |
| EP | 1035701 | 9/2000 |
| GB | 2235855 | 3/1991 |
| GB | 2 294 168 | 4/1996 |
| GB | 2 389 253 | 12/2003 |
| JP | 57069939 | 4/1982 |
| JP | 2089440 | 3/1990 |
| WO | WO 96 17431 | 6/1996 |
| WO | WO 99/25064 | 5/1999 |
| WO | WO 0059172 | 10/2000 |
| WO | WO0108370 | 2/2001 |
| WO | WO 02/078170 | 10/2002 |
| WO | WO 02/084935 | 10/2002 |

OTHER PUBLICATIONS

"Working Both Ways", Electronics & Wireless World, Dec. 1986 No. 1610, 1 page.

Engineering Notes, Power RF Amplifiers Technical Reference Material; "Load VSWR & Protection"; Date Unknown (located on the Internet); www.rf-amplifiers.com/idex.php?topic=load_protection.

Lee, James G.; "The Effects of VSWR on Transmitted Power" Date Unknown (located on the internet); www.antennex.com/preview/vswr.htm.

John R. Brews, The University of Arizona; Metal-Oxide-Semiconductor Field-Effect Transistor; The Electronics Handbook (1996), CRC Handbook in cooperation with IEEE Press; Section VII Semiconductor Device & Circuits, Subsection 37; pp. 484-497; 1996.

* cited by examiner

TEMPERATURE COMPENSATION OF COLLECTOR-VOLTAGE CONTROL RF AMPLIFIERS

FIELD OF THE INVENTION

The invention relates to amplifier compensation and in particular to a temperature compensated amplifier and modulation scheme.

RELATED ART

Communication devices have become popular in the United States and throughout the world. For various reasons, numerous different communication standards have been adopted and implemented in not only the United States, but also, in different countries. Associated with a communication standard is a usually a requirement that the wireless communication device transmit within a particular frequency range, or at a particular power level. Signals transmitted outside of this assigned frequency band and power level are highly undesirable and in violation of the standard and possibly one or more governmental regulations. Moreover, signals that do not comply with the standard or desired transmit parameters may not be possible of reception and decoding at a receiving station For example, an open-loop polar modulation architecture for a GSM/EDGE transmitter requires precision control of the RF envelope to achieve desired operation. Undesirable variation in the RF envelope control may result in performance degradation, resulting in violation of the communication standard and associated governmental regulations.

In particular, in an electronic device, variation in temperature may result in variation in device and circuit operation. For example, in a GaAs die in a power amplifier (PA) module, the temperature variation causes variation in RF envelope control, resulting in degradation of the adjacent channel spectrum. With prior art systems, where precise envelope control is not necessary, such temperature-related device variation may be acceptable. However, in higher precision systems or more precise standards, such as an EDGE type system, temperature-related device variation may cause significant performance degradation and can not be ignored.

In an RF amplifier, the RF voltage swings between Vce (min) and twice the applied collector voltage (2×Vcc), when operated over a range of temperatures. Vce(min) is dominated by the emitter saturation voltage, Vce(sat), which is dependent on temperature. Hence, the output power of the RF amplifier varies due to the Vce(sat) temperature coefficient of the amplifier transistors.

This is shown graphically in FIG. 1, wherein the RF voltage (Vrf) is shown on a vertical axis 104 in relation to the temperature, which is shown in the horizontal axis 108. Also shown in FIG. 1 is a plot 112 of (2×Vcc) and a plot 116 of Vce(min). The RF voltage swing ranges between (2×Vcc) and Vce(min).

As can be observed, as temperate changes so to does Vce (min). At higher temperatures, the RF voltage swing is reduced. This effect is particularly noticeable near the turn-on threshold of the amplifier, where Vcc approaches Vce(min). Hence, as Vce(min) varies with temperatures above and below the calibration temperature, an error term is created. Most often room temperature is utilized for ambient calibration temperature.

The variation in threshold is particularly critical in an application where Vcc is used for amplitude modulation, such as polar modulation type systems. In these applications, the transceiver controls the PA based on a known relationship between Vcc and the output power, which is determined by room-temperature calibration. However, when the turn-on threshold varies over temperature, such as shown graphically in FIG. 1, the amplitude modulation is corrupted, resulting in degradation of Error Vector Magnitude (EVM) and the modulation spectrum performance.

Different solutions have been proposed to overcome the drawbacks in the prior art, but such solutions are unacceptable or do not adequately overcome the problem. One such solution is temperature compensation at a system level through software. This is not an optimal solution because the resolution requirements for the digital to analog converter required for software based implementation are significant. In addition, attempts to detect and monitor the RF amplifier temperature results in inaccuracies or undesirably complex implementations.

Consequently, there is a need in the art for an accurate and efficient temperature compensation method in PA modules. The invention provides such a solution by minimizing variation in output power over temperature by compensating the regulated voltage Vcc. As described below, the method and apparatus as described and claimed herein provides a solution to the drawbacks of the prior art and additional benefits.

SUMMARY

To overcome the drawbacks of the prior art and provide additional benefits, a temperature compensation system for an RF amplifier is disclosed. In one method of operation, the system temperature compensates an RF amplifier when generating an RF output signal. This method comprises providing a control signal to a voltage (or current) dependent voltage source. The control signal may comprise or be related to the amplitude or envelope of a data signal. The voltage-dependent voltage source generates a temperature-independent voltage related to the control signal. The method also comprises generating or providing a temperature-dependent voltage source. This voltage is added to the control signal-dependent voltage source. Thereafter, this method applies the composite voltage generated by the sum of the two voltage sources to one or more collectors of the RF amplifier to thereby generate a temperature compensated RF output signal.

In one embodiment, the voltage-controlled voltage source comprises a low drop-out voltage regulator (LDO). The LDO is comprised of an error amplifier configured in a feedback loop to generate an output voltage dependent upon an input control signal. The LDO may include a feedback network comprised of, but not limited to, resistors and offset current or voltage sources to set the desired relationship between the input control signal and the regulated output voltage. The LDO may also include a voltage-controlled current source, such as a PFET, to provide the necessary collector current for the RF amplifier while maintaining a regulated collector voltage.

As described below in more detail, applying the collector voltage to an output of the RF amplifier reduces phase distortion in the RF output signal, which is another benefit of this method of operation.

Also disclosed herein is a system for generating a temperature compensated RF output signal. In one embodiment, a differential amplifier is configured to receive a control signal and an offset signal to thereby generate a variable voltage source control signal. A temperature dependent offset signal generator is also part of this system and is configured to generate the offset signal. A variable voltage source is configured to generate an applied collector voltage in response to the variable voltage source control signal. An RF amplifier, which is part of this embodiment, is configured to receive an RF signal and output an amplified RF signal, wherein the amplitude of the amplified RF signal is dependent on the applied collector voltage and the control signal.

In one embodiment the control signal represents data. It is also contemplated that the temperature dependent offset signal generator may comprise one or more current sources and a resistor network, and the variable current source may comprise a semiconductor device, such as a PFET. With regard to the resistor network, it may be configured to convert a temperature compensation current to the offset signal.

Also disclosed herein is a system for temperature compensating an amplifier. In one configuration, this embodiment comprises a first input configured to receive a band gap current signal and a second input configured to receive a temperature proportional current signal. A network is provided and configured to combine the band gap current signal and the temperature proportional current signal to create an offset signal. Likewise, a differing amplifier is provided and configured to generate a control signal. A voltage control device, such as a PFET, is provided and configured to receive the control signal and thereby generate an amplitude modulation signal which is utilized to amplitude modulate an outgoing signal. The amplitude modulated outgoing signal is temperature compensated due to the temperature proportional current signal. This allows the RF power level to remain constant or at the desired at different temperatures.

It is contemplated that the band gap current signal comprises a current signal that is not temperature dependent. This system may further comprise an input configured to receive a data signal, such that the data signal and the offset signal generate the control signal and the control signal is temperature compensated. In one embodiment, the network comprises one or more resistors. It is also contemplated that in one embodiment the amplitude modulation signal is combined with an output of an RF amplifier to generate an amplitude modulated control signal. Moreover, this system may be utilized in a mobile communication device or a base station for use in a wireless communication network.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
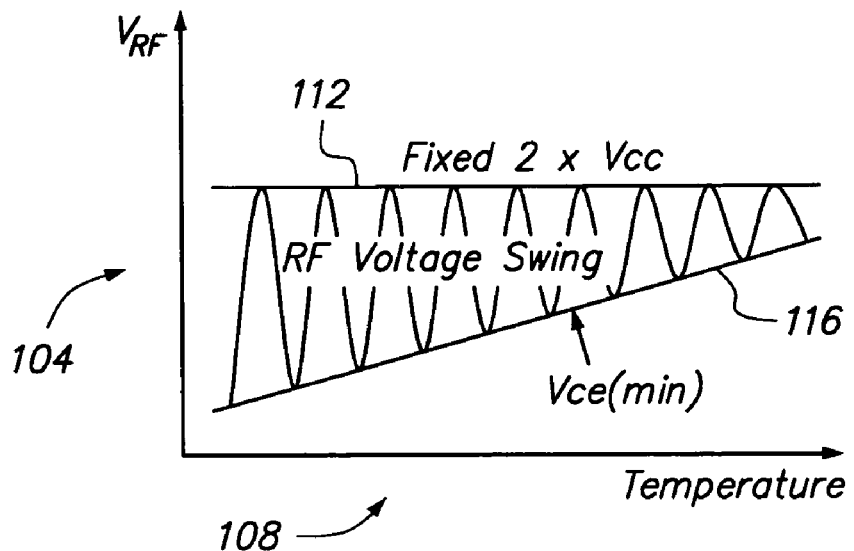
FIG. 1 illustrates an example plot of output power of the PA as it varies due to temperature change.
Figure 2:
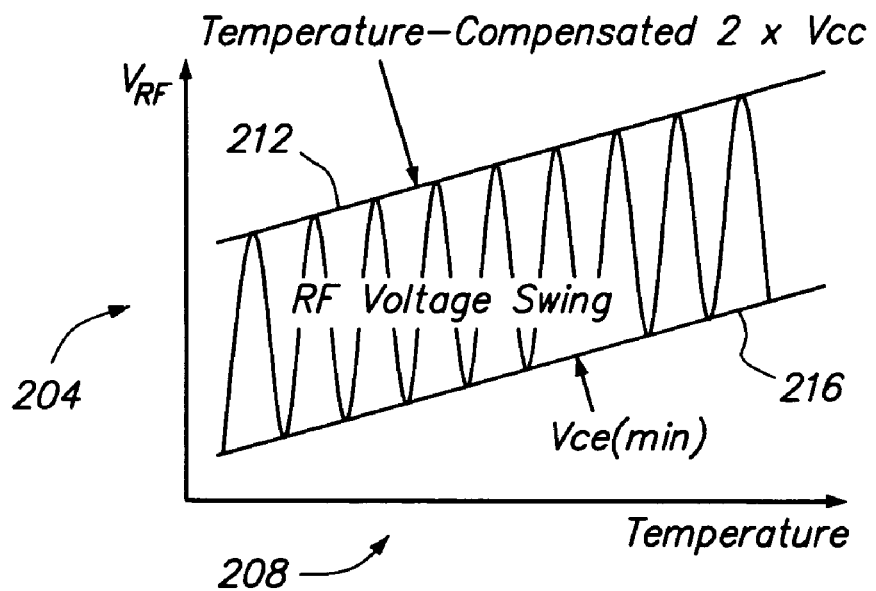
FIG. 2 illustrates an example plot of a voltage Vcc compensated system.

To overcome the drawbacks of the prior art, a temperature compensated amplifier is disclosed. In the temperature compensated system described herein the voltage Vce(sat) remains fixed, although dependent on temperature, while the voltage Vcc is compensated. FIG. 2 illustrates an example plot of such an arrangement. As shown in FIG. 2, a vertical axis 204 represents RF voltage while a horizontal axis 208 represents temperature. A (2×Vcc) plot 212 is shown as representing the upper range of the RF voltage swing while a Vce(sat) plot 216 represents the lower boundary of the RF voltage swing. In this plot of FIG. 2, as compared to FIG. 1, it can be seen that (2×Vcc) plot 212 has been compensated for temperature such that as temperature increases, so to does Vcc. In this manner, the output power or voltage swing, if so desired, may be maintained constant and not be limited by the upper boundary of (2×Vcc).

Figure 3:
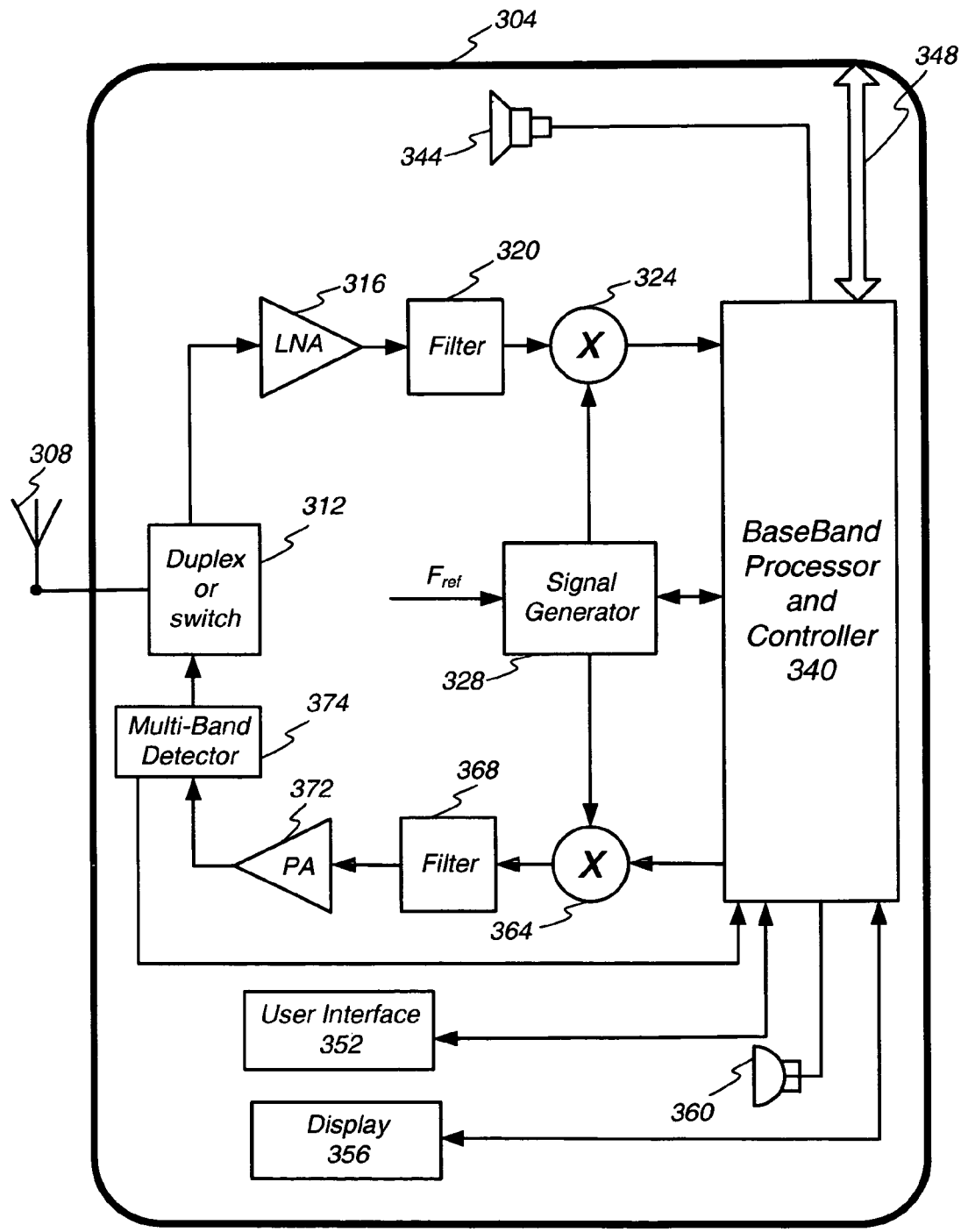
FIG. 3 illustrates a block diagram of a first example environment of use of the invention.

Before discussing the details of the various embodiments of the invention, various example environments of use are discussed and illustrated. FIG. 3 illustrates a block diagram of a first example environment of use of the invention. The example environment shown in FIG. 3 comprises a wireless communication device but it is noted that this is but one of many possible example environments of use. It is contemplated that the invention may find use and provide benefit in numerous other environments both in the communication field and other fields of use.

The wireless communication device shown in FIG. 3 comprises an outer housing 304 configured to protect and selectively enclose the internal electronic apparatus. An antenna 308 receives incoming signals and transmits outgoing signals. The antenna 308 may be located inside or outside of the housing 304. A duplexer 312 connects to the antenna 308 to route incoming signals to a receiver apparatus, shown as the upper path from the duplexer 312 and route outgoing signals to the antenna.

The duplexer 312 connects to a receiver apparatus to thereby route received signals to a low noise amplifier (LNA) 316 that is configured to increase the signal power level for a particular frequency band to a level appropriate for processing by subsequent apparatus. The LNA 316 output connects to a filter 320 which may be configured to perform additional filtering or processing, such as for example band pass filtering or processing to mitigate the effects of the wireless channel.

After filtering, a mixer 324, also known as a down-converter, processes the received signal in conjunction with a signal from a signal generator 328. The mixer may be configured to extract a base band signal by multiplying the received signal at a carrier frequency with a signal from the signal generator that is also at the carrier frequency. As is well understood, the mixer 324 outputs the desired carrier signal.

The output from the mixer 324 feeds into a base band processor and controller 140 configured to receive and process the incoming base band signal. In one embodiment, the base band processor and controller 340 converts the incoming signal to a digital format, processes the digital signal, and then creates an analog signal which is provided to a speaker 344. Alternatively the digital signal may be provided directly to a data port 348. In this embodiment, the base band processor and controller 340 is in communication with the signal generator 328 to synchronize operation.

The base band processor and controller 340 is also configured to communicate data to and from a user interface 352, such as with one or more keys or buttons, and a display 356 configured to display text, graphics, or other information to a user.

To perform transmission of outgoing signals, the base band processor and controller 340 may receive a signal from a microphone 360 or digital data from the data port 348. Upon receipt of an outgoing signal, the base band processor and controller 340 processes the outgoing information to a base band signal and outputs this base band signal to a mixer 364, which may also be referred to as an up-converter. The mixer 364 multiplies the base band signal with an input from the signal generator 328 at the desired carrier frequency. The resulting outgoing signal comprises the base band signal modulated to the carrier frequency and is ready for filtering and processing by the filter 368 and then amplification by an RF amplifier 372 to a power level suitable for transmission by the antenna 308 after passing through the duplexer 312. The output amplifier system may be configured in any manner and may benefit from the method and apparatus described herein.

In this embodiment a multiband detector 374 receives the output from amplifier 372. The multiband detector 374, if so equipped, may monitor one or more aspects of the outgoing signal, such as amplitude or power level. In one embodiment, the detector 372 may provide a feedback or data signal to the controller 340 as shown. As discussed below in more detail, the detector 374 may monitor the amplitude of the outgoing signal, i.e. the signal being transmitted, and provide information regarding the amplitude to the controller 340.

Figure 4:
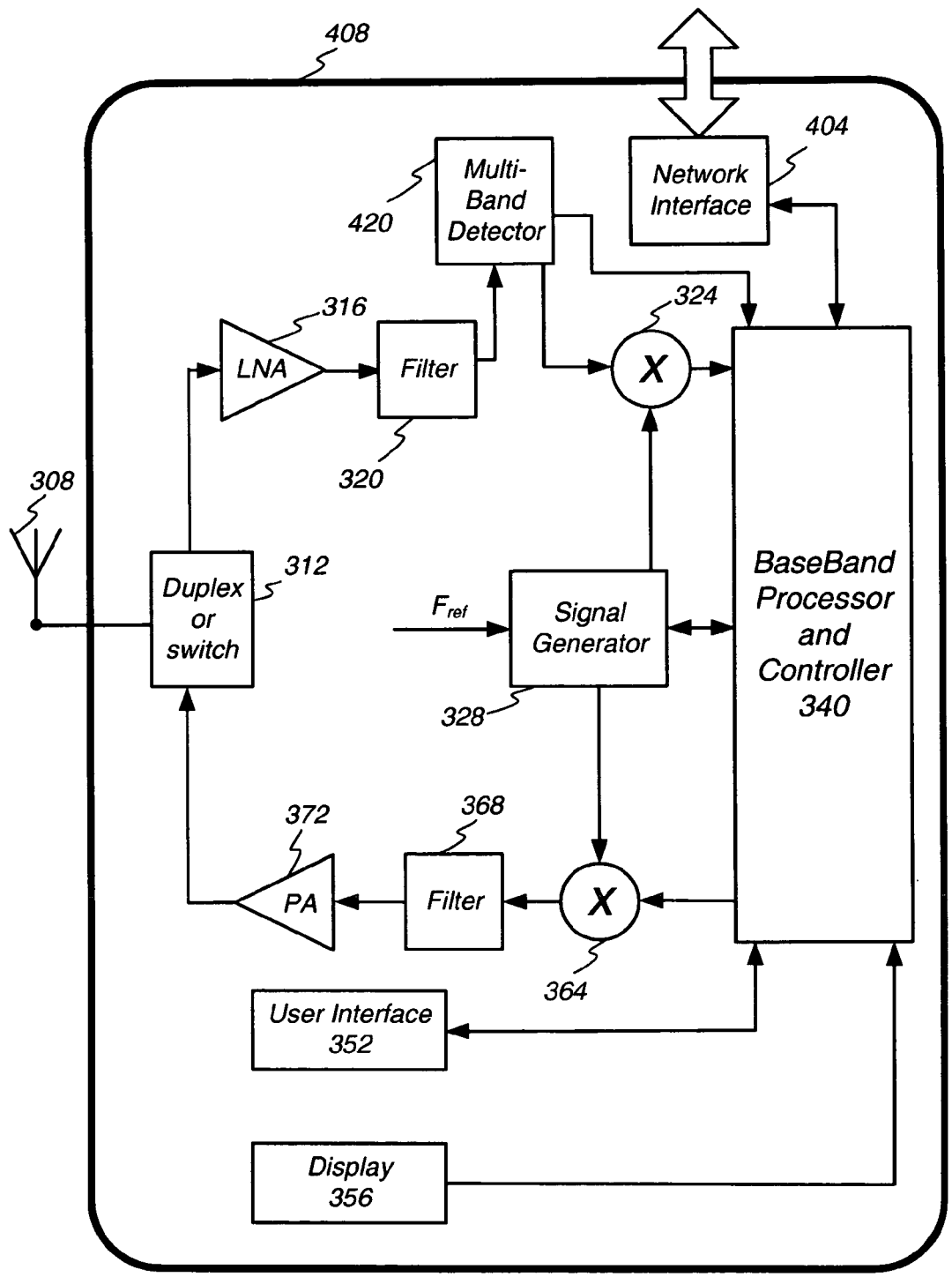
FIG. 4 illustrates a block diagram of a second example environment of use of the invention.

FIG. 4 illustrates a block diagram of a second example environment of use of the invention. FIG. 4 shares numerous similarities with FIG. 1 and thus, wherein the aspects that differ from FIG. 3 are discussed in detail. The embodiment of FIG. 4 is directed to a base station 408 or non-mobile communication device configured to communicate with one or more other communication devices. In this configuration, which may represent a base station communication system 408, the base band processor and controller 340 communicate with a network interface 404. The network interface 404 may be configured to receive one or more signals or packet-based-data from the processor and controller 440. The one or more signals or packet-based-data is output to a computer network, internet, PSTN, or other medium that interfaces with a telephone network, data network, or cellular communication system. When configured as a base station 408, the system shown in FIG. 4 facilitates completion of a mobile telephone call, such as a telephone call from a cell phone or to a land line. These calls are often completed via the network interface 404 of the base station 408.

Also shown in FIG. 4 is a multiband detector 420, which in this embodiment is configured to receive the output of the filter 320. The detector 420 passes the incoming signal to the mixer 324, while also providing information or data regarding one or more aspects of the incoming signal to the controller 340.

As way of introductory information, in a collector-voltage controlled RF amplifier, the output power is defined by a regulated voltage applied to the collector of one or more stages of the amplifier. The output power is defined by the expression:

$$Pout = \frac{(2 \times Vcc - Vce(\min))^2}{8 \times Rload}$$

where Vcc is the applied collector voltage and Vce(min) is minimum level of output voltage swing, dominated by the collector emitter saturation voltage, Vce(sat). Rload is the total impedance presented to the amplifier by a matching network. By supplementing or compensating the voltage Vcc, the output power may be maintained over temperature.

Figure 5:
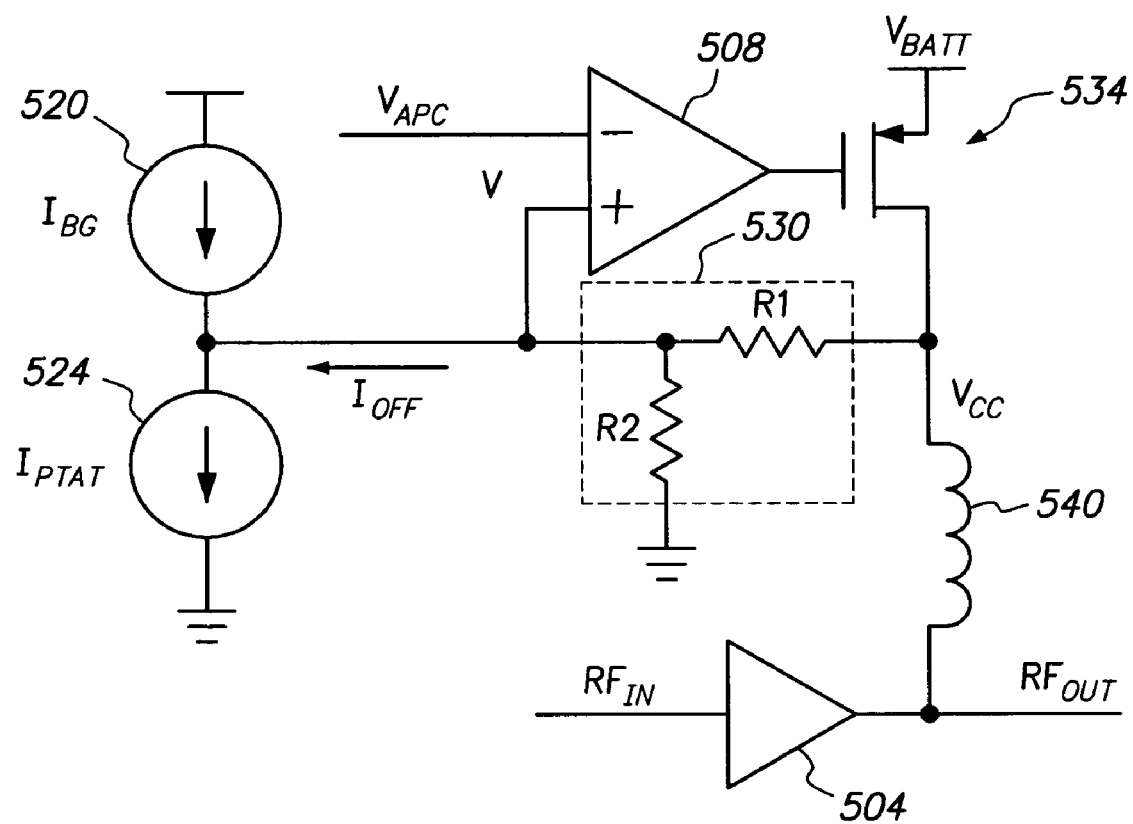
FIG. 5 illustrates one example generalized circuit diagram of a temperature compensated RF amplifier.

FIG. 5 illustrates one example generalized circuit diagram of a temperature compensated RF amplifier. This is but one possible example embodiment and as such it is contemplated that other embodiments may be enabled that do not depart from the claims that follow. In this example embodiment, an RF input signal is provided to an RF amplifier 504. The output of the RF amplifier 504 comprises the output signal, which is coupled to the antenna. The RF amplifier may comprise one or more of any type amplifiers. In this example embodiment, the modulation scheme comprises amplitude modulation. As such, the RF output is amplitude modulated based on a control signal, shown in FIG. 5 as the amplifier power control (APC) voltage ($V_{APC}$). The $V_{APC}$ signal may comprise any type signal capable as serving as a data or control signal to control the modulation or coding scheme. In this embodiment the $V_{APC}$ signal is received in an analog format from a digital signal processor. Any type processor or source may generate the $V_{APC}$ signal, including, but not limited to a control circuit, control logic, state machine, digital signal processor, ASIC, or micro processor.

The Vapc signal is provided to low drop-out (LDO) voltage regulator that is configured as a non-inverting feedback loop comprising the error amplifier 508, PFET 534, resistive network 530, and offset current sources $I_{BG}$ 520 and $I_{PTAT}$ 524. The error amplifier 508 provides gain to maintain the accuracy of the feedback loop. The PFET 534 provides the collector current drawn by the RF amplifier 504 without loading the error amplifier 508, maintaining a regulated collector voltage over a large range of collector currents. In other embodiments, the PFET may be replaced by an NFET, bipolar PNP, NPN, or other semiconductor device. The resistive network 530 affects the transfer function of the LDO regulator. The network may also include other components, such as capacitors, for frequency shaping or other modifications of the LDO transfer function. The offset current sources 520 and 524 are used in combination with the resistive network 530 to generate an offset in the LDO transfer function.

The offset current $I_{BG}$ 520 is used in combination with the resistive network 530 to generate a temperature-independent offset voltage. The $I_{BG}$ current source is generally developed from a band gap voltage reference, $V_{BG}$, and a resistance, R, with the same temperature and process characteristics as the resistive network 530. Since a band gap voltage is generally temperature-independent, and the temperature characteristics of the resistors track together, the resultant offset voltage, Voff1=$V_{BG}$/R×R1 is temperature-independent. While the offset current $I_{BG}$ is dependent on the temperature characteristics of the resistance R, its resultant offset voltage is temperature-independent, so for simplicity, it is hereafter referred to as a temperature-independent or bandgap current source. The method and apparatus for developing a bandgap voltage is understood in the art.

The offset current $I_{PTAT}$ 524 is used in combination with the resistive network 530 to generate a temperature-dependent offset voltage. The $I_{PTAT}$ current source is proportional to absolute temperature, which is a current signal that is based on and related in magnitude to the temperature of the device or die. When combined with the resistive network 530, the resultant offset voltage, Voff2=$I_{PTAT}$×R1 is temperature-dependent. The method and apparatus for developing a current that is proportional to absolute temperature (PTAT) is understood in the art.

The resultant output voltage of the LDO regulator, Vcc, is applied to an RF choke 540, which is connected to the collectors of one or more stages of the RF amplifier 504. The amplified RF signal is thereby modulated by the collector voltage, Vcc, to a level determined by the amplitude control signal, Vapc. The choke operates as is understood in the art.

As a result of the temperature compensated $V_{off}$, which is dependent on the current signals $I_{BG}$ and $I_{PTAT}$, the voltage Vcc is likewise compensated to track Vce(sat), thereby maintaining a constant output power, for a particular input, over temperature. In reference to FIG. 2, Vcc may swing with temperature, in a manner similar or identical to Vce(sat) to thereby maintain a desired RF voltage swing.

A more detailed discussion of operation is now provided. The regulated voltage supplied to the collectors of one or more stages of a PA is typically a linear function of the control voltage $V_{APC}$. This is accomplished using a linear regulator with an injected offset current $I_{OFF}$ as is shown in FIG. 3. The voltage Vcc may be defined as follows:

$$Vcc = \left(1 + \frac{R1}{R_2}\right) \times V_{APC} + I_{OFF} \times R1$$

As discussed above, a PA used in a polar modulation scheme is typically calibrated at room temperature and curve-fit to a linear relationship between RMS output voltage, Vrf and the control voltage, $V_{APC}$, with the following form:

$Vrf = \text{Gain} \times V_{APC} + \text{Offset}$

Although the gain of the PA is affected by the thermal variation of Vce(sat), a variation in gain is seen only as a variation in output power, since it simply scales the output waveform. However, variation in the offset causes degradation in EVM and ACPR, since it does not affect the waveform in a scalar manner. For example, the nulls of a modulation waveform will be affected more than the peaks. In one example system, a 50 mV drift corrupts the waveform by 10% when Vrf is 0.5V but only 1.4% when Vrf is 3.5V. This corruption occurs in the modulation constellation and spectrum. Therefore, by compensating the linear regulator, such that the offset term Ioff×R1 tracks the temperature variation of Vce(sat), the offset variation and the modulation distortion due to temperature can be minimized.

To compensate the linear regulator, namely the input to device 534 using the amplifier 508, the offset term, such as $I_{OFF}$ is generated using a combination of $I_{PAT}$, which represents a current that is proportional to absolute temperature, i.e. which changes with temperature, and a band gap reference current ($I_{BG}$), which does not change with temperature. The resultant offset current has a value of $I_{OFF}=I_{PTAT}-I_{BG}$. Therefore, $V_{OFF}$ is also temperature dependent and related to the $I_{OFF}$ and R1 from FIG. 5. Consequently, $V_{OFF}$ thus has a PTAT and a band gap component, and the transfer function can be designed such that the temperature dependent term ($I_{PTAT}\times R1$) tracks the temperature profile of Vce(sat). Vce (sat) may be measure empirically or determined in any other way, either in real time during operation, or during manufacturing and/or testing. By knowing the composite temperature coefficient, Tc of the PTAT current source and R1, the transfer function of the linear regulator as a function of $V_{APC}$ and temperature can be re-written as:

$Vcc(V_{APC}, T) =$ $$\left(1 + \frac{R1}{R2}\right) \times V_{APC} - I_{BG} \times R1 + I_{PTAT} \times (1 + Tc)(T - Tnom) \times R1$$

where Tnom is the nominal temperature and $I_{PTAT}$ is the nominal PTAT current at T=Tnom. Hence, by setting Tc× $IP_{PRAT}\times R1$ equal to the Vce(sat) temperature coefficient, Vcc will track Vce(sat) over temperature.

Figure 6:
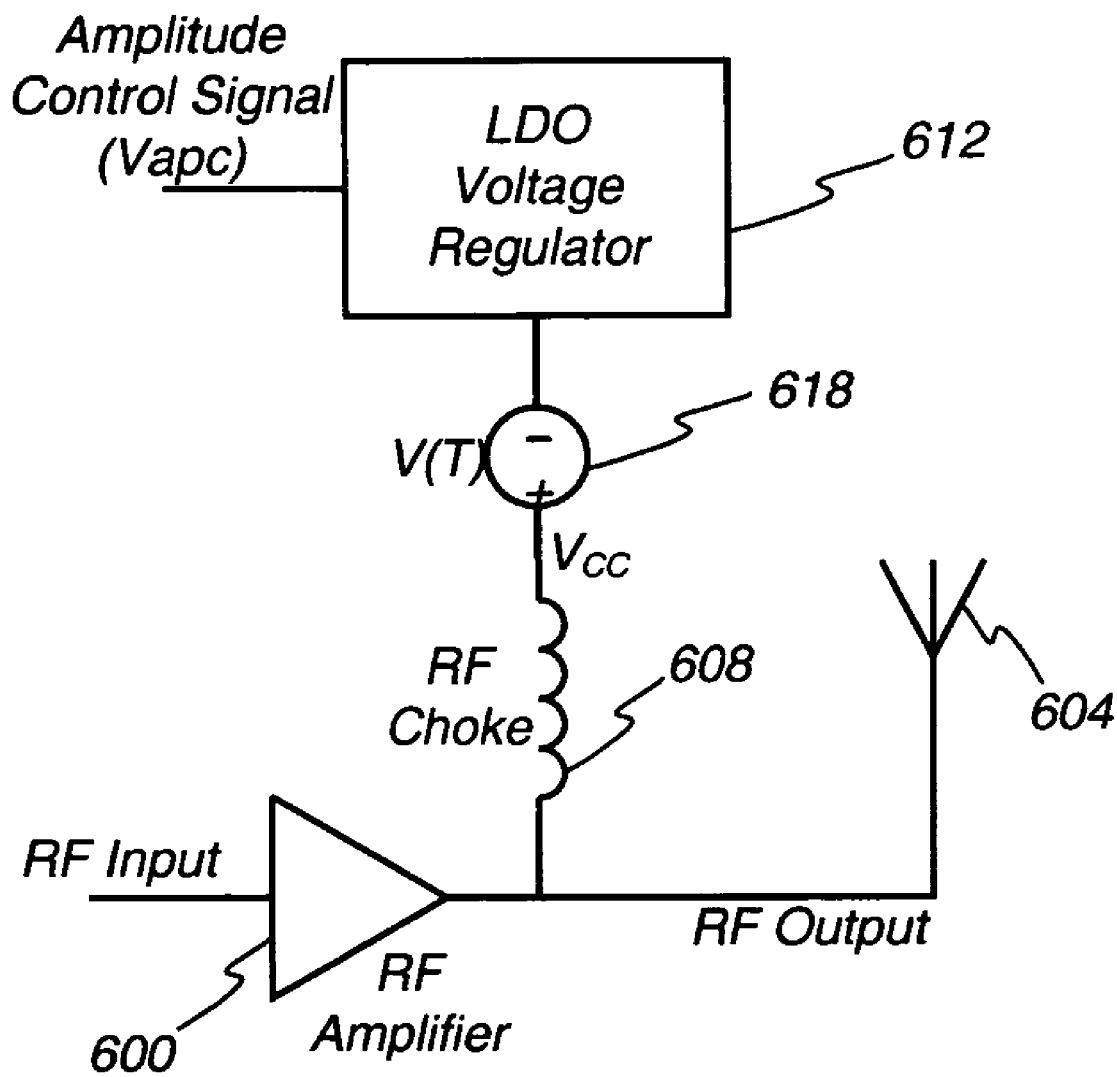
FIG. 6 illustrates a generalized circuit diagram of a temperature-compensated RF amplifier.

FIG. 6 illustrates one example generalized block diagram of a temperature compensated RF amplifier. This is but one possible example embodiment and as such it is contemplated that other embodiments may be enabled that do not depart from the claims that follow. In this example embodiment, an RF input is provided to an RF amplifier 600. The output of the RF amplifier 600 comprises the output signal, which is coupled to the antenna 604. Optional processing may occur between the RF amplifier 600 and the antenna 604.

In this example embodiment, the amplifier 600 is configured as a voltage-saturated amplifier, where the output amplitude is determined by the collector voltage presented to one or more stages of the amplifier. The amplitude of the output signal is determined by the voltage, $V_{CC}$, presented to the amplifier collectors through an RF choke 612. The collector voltage $V_{CC}$ is generated by summing a control signal dependent voltage with a temperature-dependent compensation voltage, V(T) 618. In this example embodiment, the control signal dependent voltage is generated by a low drop-out (LDO) voltage regulator 612 with a transfer function Vout=H (Vapc), where Vapc is the amplifier power control signal. Therefore, the composite collector voltage applied to the RF amplifier 600 through the RF choke 608 is $V_{CC}$=H(Vapc)+V (T).

Figure 7:
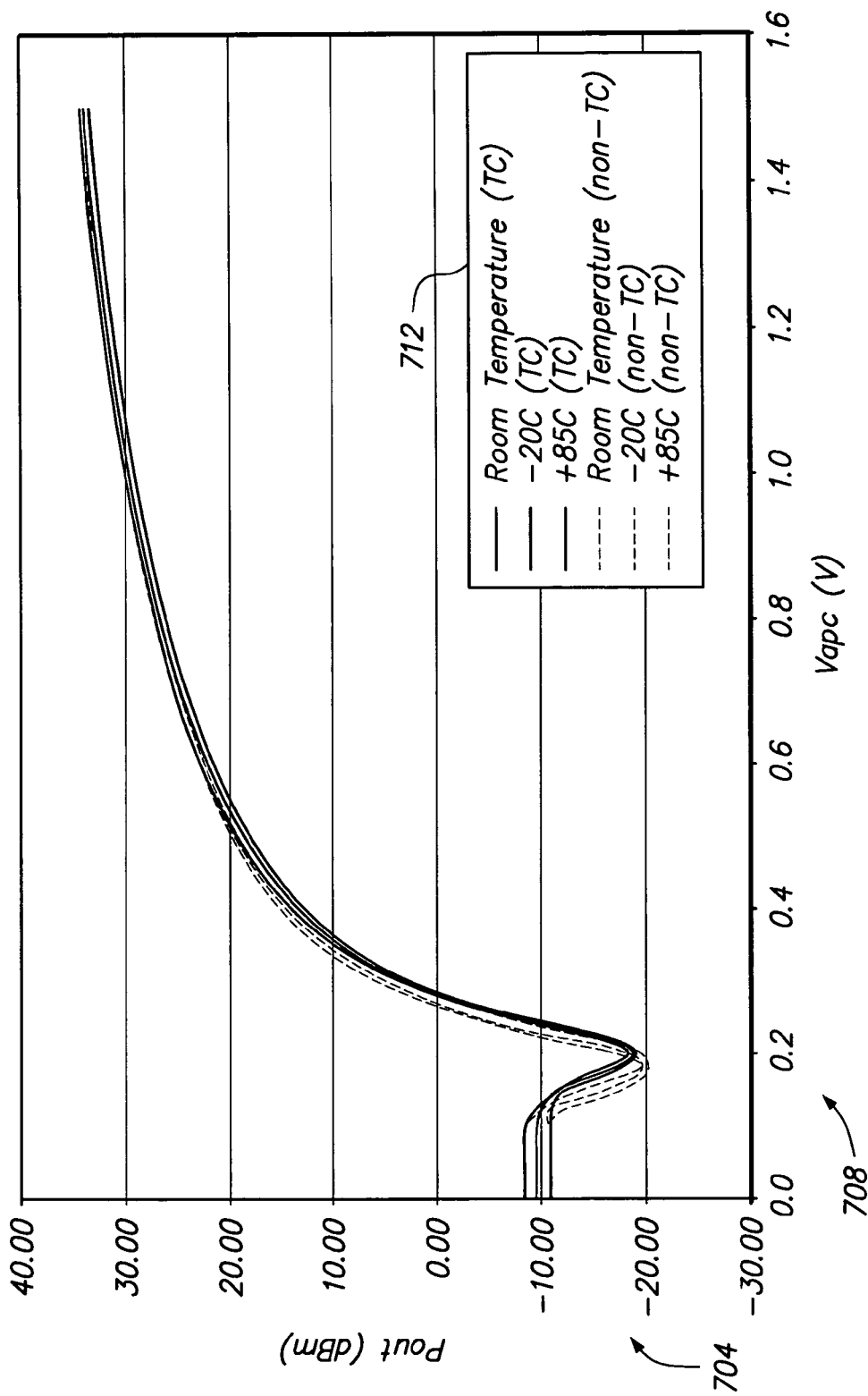
FIGS. 7 and 8 illustrate exemplary signal plots showing the improvements realized by the method and apparatus disclosed herein.
Figure 8:
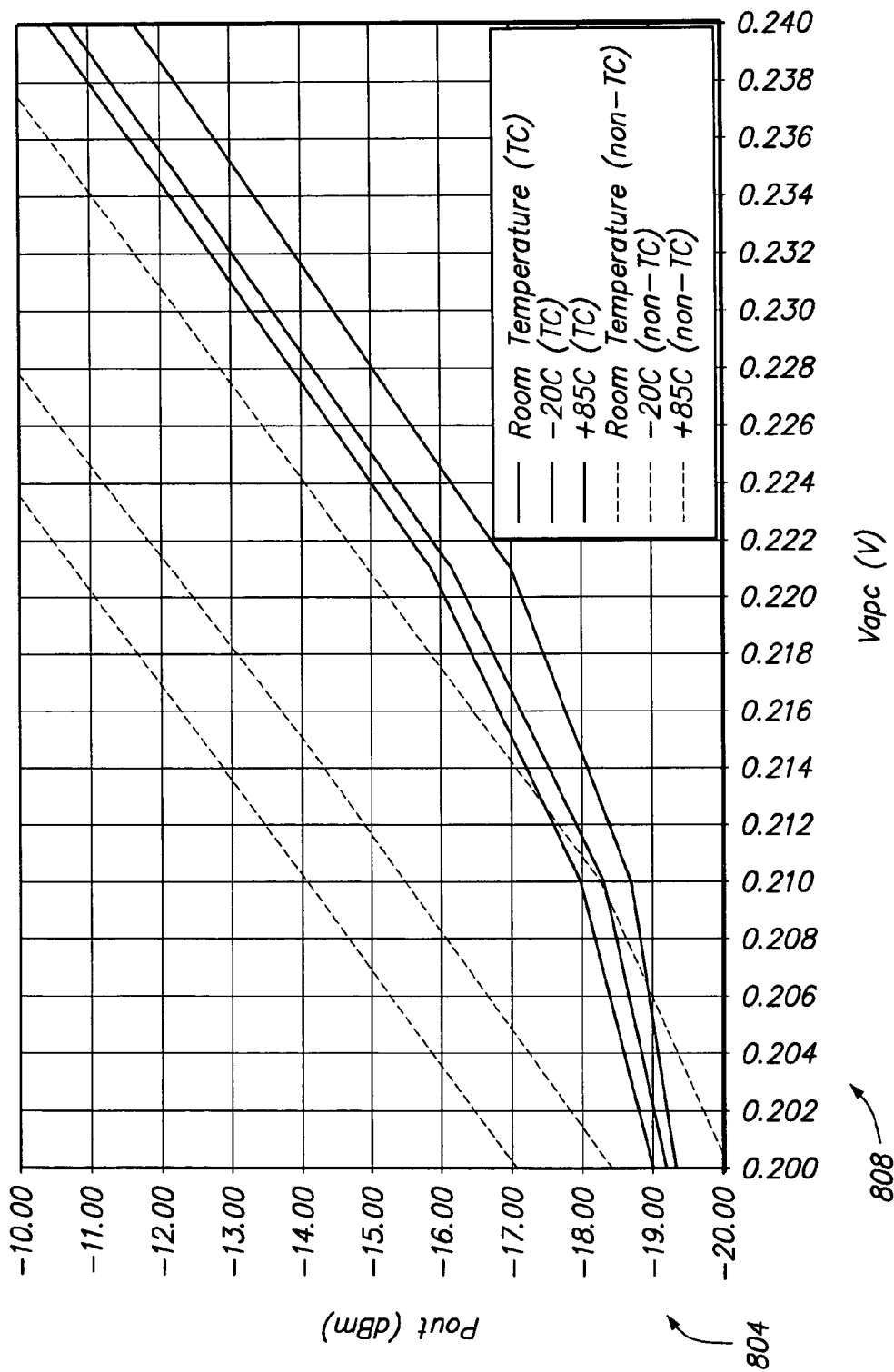

FIGS. 7 and 8 illustrate exemplary signal plots showing the improvements realized by the method and apparatus disclosed herein. In reference to FIG. 7, the vertical axis 704 represents output power (Pout) while the horizontal axis 708 represents the control voltage, such as for example, $V_{APC}$.

In this plot of FIG. 7, the dashed lines represent the uncompensated signal plots at the various temperatures as indicated in the key 712. As can be seen, the three different dashed line un-compensated plots differ significantly at each different temperature, namely, −20 degrees C., room temperature, and 85 degrees C. During operation such variation in output power, for a given $V_{APC}$, over temperature, is undesirable.

In contrast, the solid lines of the plot of FIG. 7 represent the performance of a temperature compensated system. As can be seen, these plots are more closely related at each of the different temperatures than the dashed line uncompensated plots. The plots for the compensated system were created at identical temperatures to those for the uncompensated system.

The improvement is considerable in the low power regions, particularly since the deviation is a greater overall percentage of the desired output signal. This is shown more clearly in FIG. 8, which is an enlarged plot of apportion of FIG. 7. FIG. 8 utilized a more highly defined scale on the vertical axis 804 and horizontal axis 808. In the plot of FIG. 8, the output power is shown on the vertical axis 804 which ranges from −20 to −10 dBm. $V_{APC}$ is shown on the horizontal axis 808, which ranges from 0.20 to 0.24 volts. This plot, although showing the same plots generated at the same temperature points, more clearly illustrates the superior operation of the temperature compensated system at low power conditions. In this plot, the variation over temperature is reduced 14 mV to only 4 mV.

An additional benefit of temperature compensating an RF amplifier is a reduction in variation of the phase shift through the RF amplifier. Since the phase shift through the device is related to the signal swing across the device (amplitude-to-phase distortion), the amount of phase shift through the device varies with temperature in an uncompensated system. By applying temperature compensation and thereby better maintaining the RF output signal swing over temperature, the amount of phase shift can be maintained over temperature. Since the amount of phase shift is typically characterized at room temperature in a polar modulated system, any variation in phase shift can cause significant distortion in EVM or modulation spectrum.

Figure 9:
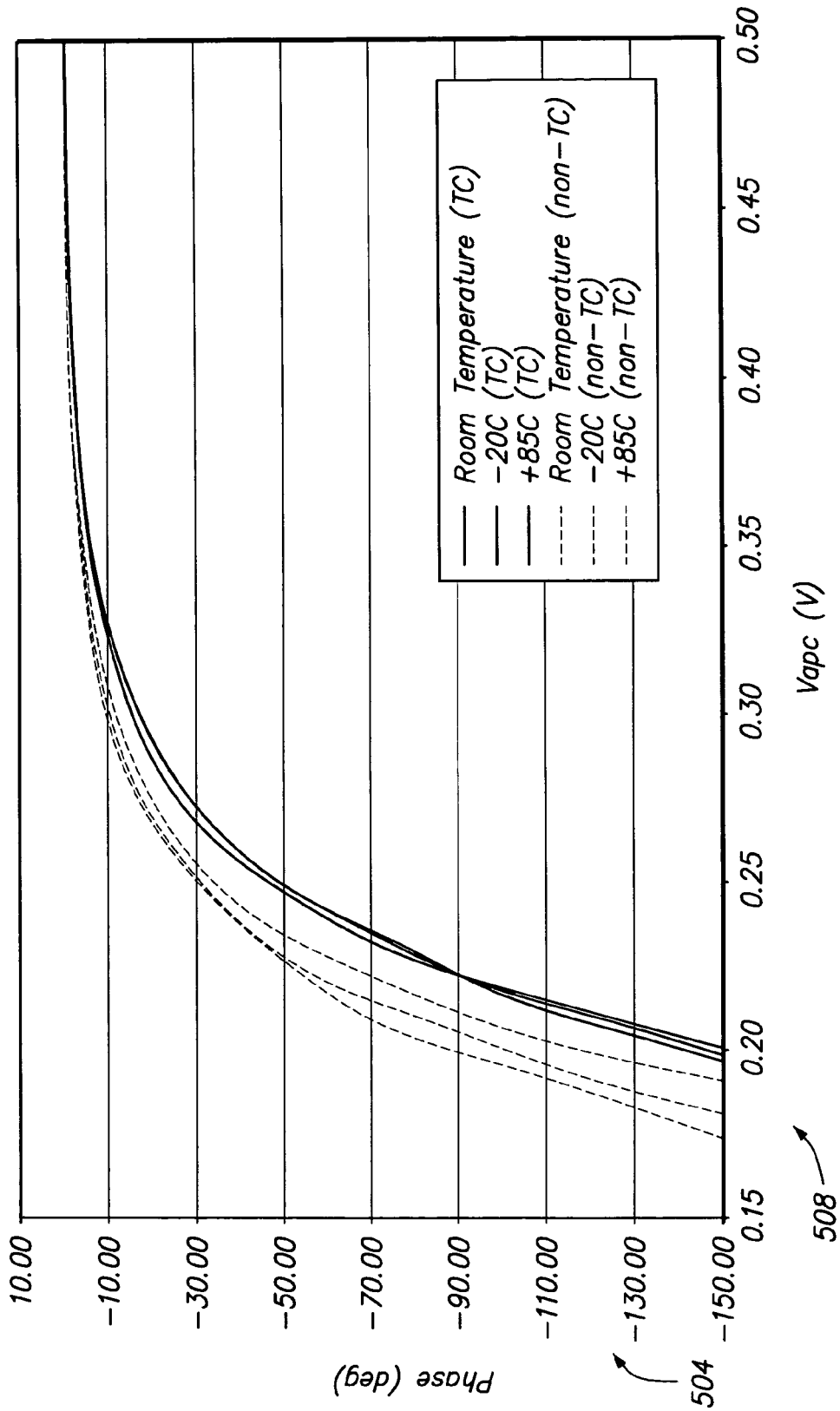
FIGS. 9 and 10 illustrate exemplary signal plots showing the improvement in phase shift verses $V_{APC}$ as realized by the method and apparatus disclosed herein.
Figure 10:
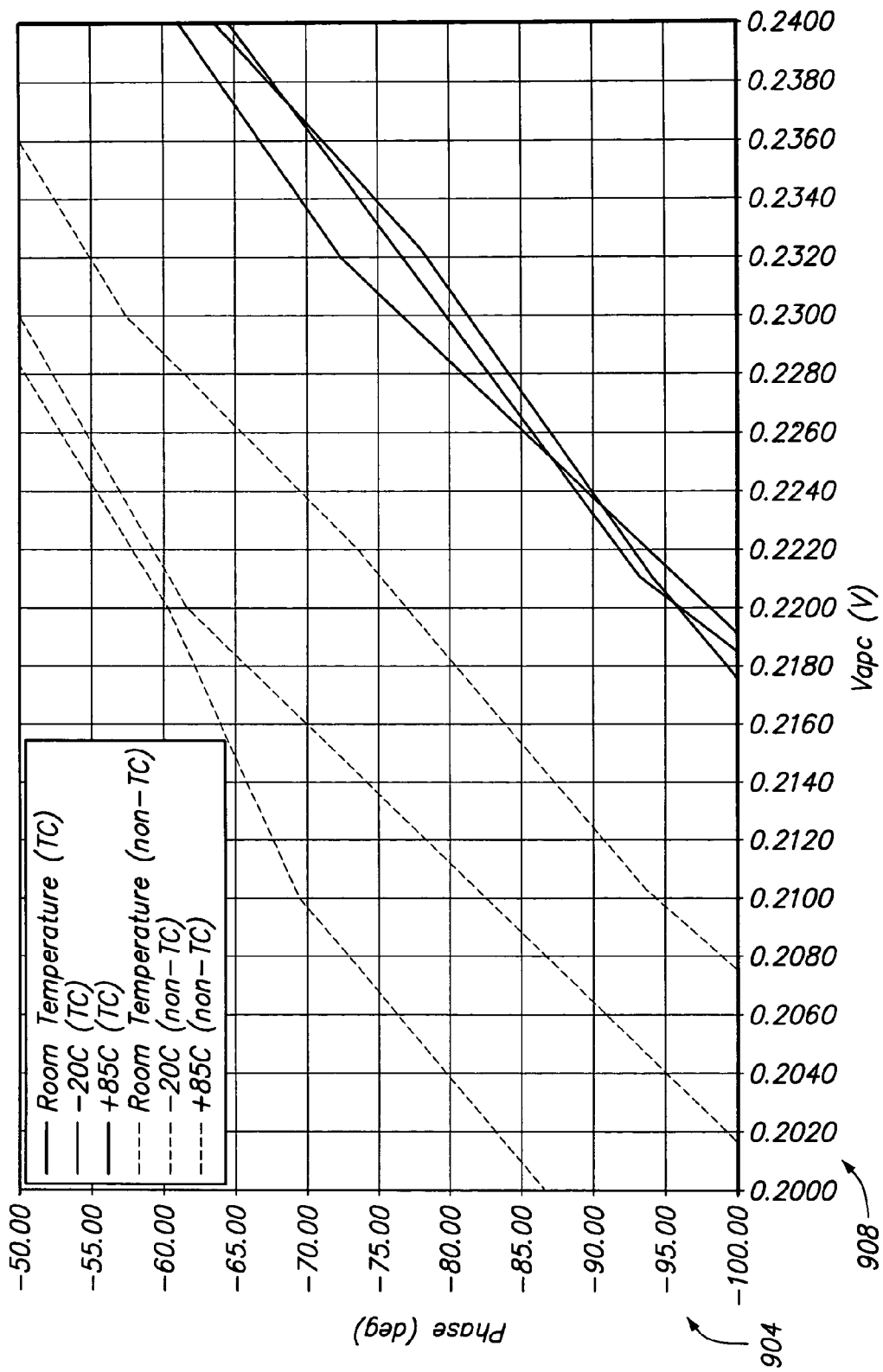

FIGS. 9 and 10 illustrate plots of phase shift verses $V_{APC}$ at various different temperatures for a compensated and un-compensated system. FIG. 10 is an enlarged version of a portion of FIG. 9, focusing in on $V_{APC}$ from 0.200 to 0.240 volts. In these plots, the vertical axis 904 represents phase shift in degrees while the horizontal axis 908 represents the voltage $V_{APC}$. The dashed lines represent the uncompensated plots at various temperatures. As can be seen in FIGS. 9 and 10, the un-compensated plots shown by the dashed lines have significant phase shift at each of the different temperatures, namely −20 degrees C., room temperatures, and +85 degrees.

The solid lines represent performance of the compensated system at the same temperatures which the un-compensated plots were created. As can be appreciated, a significant improvement is evident for the temperature compensated solid lines. In fact, the compensated system has a phase shift that is reduced from 20 degrees to less than 5 degrees, which is a significant advantage.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A method for temperature compensating an RF amplifier when generating an RF output signal comprising:
   providing a control signal to a differential amplifier;
   generating a band gap current which is temperature independent;
   generating a temperature proportional current which is temperature dependent;
   converting the band gap current and the temperature proportional current to an offset voltage which is temperature dependent;
   providing the offset voltage to the differential amplifier;
   generating a temperature compensated control signal with the differential amplifier;
   generating an applied collector voltage based on the temperature compensated control signal;
   applying the applied collector voltage to an output of the RF amplifier to thereby generate a temperature compensated RF output signal.

2. The method of claim 1, wherein the differential amplifier comprises an error amplifier.

3. The method of claim 1, wherein the control signal comprises a data signal.

4. The method of claim 1, wherein the RF output signal is amplitude modulated.

5. The method of claim 1, wherein the applied collector voltage is further supplemented by a network voltage, wherein the network voltage comprise a voltage related to a network resistance, the temperature proportional current, and the band gap current.

6. The method of claim 1, wherein the method of claim 1 is also for reducing the phase distortion in the RF output signal.

7. A system for generating a temperature compensated RF output signal comprising:
   a temperature dependent offset signal generator configured to generate an offset signal, the temperature dependent offset signal generator comprising:
      a first current source connected to one or more resistors to create a temperature independent voltage;
      a second current source connected to the one or more resistors to create a temperature dependent voltage;
      a junction configured to combine the temperature independent voltage and the temperature dependent voltage to create the offset signal;
   a differential amplifier configured to receive a control signal and the offset signal to thereby generate a variable voltage source control signal;
   a variable voltage source configured to generate an applied collector voltage in response to the variable voltage source control signal; and
   an RF amplifier configured to receive an RF signal and output an amplified RF signal, wherein the amplitude of the amplified RF signal is dependent on the applied collector voltage and the control signal.

8. The system of claim 7, wherein the control signal represents data.

9. The system of claim 7, wherein the temperature dependent offset signal generator comprise a temperature dependent current source.

10. The system of claim 7, wherein the variable voltage source comprises a PFET.

11. The system of claim 7, wherein the system comprises an EDGE compliant system.

12. The system of claim 7, wherein the one or more resistors comprises a resistor network configured to combine the temperature independent voltage and the temperature dependent voltage to create the offset signal.

13. A system for temperature compensating an amplifier comprising:
   a first input configured to receive a band gap current signal;
   a second input configured to receive a temperature proportional current signal;
   a network configured to combine the band gap current signal and the temperature proportional current signal and create an offset signal;
   a differing amplifier configured to receive and process the offset signal and a temperature uncompensated control signal to generate a temperature compensated control signal;
   a voltage control device configured to receive the control signal and thereby generate an amplitude modulation signal which is utilized to amplitude modulate an outgoing signal, wherein the amplitude modulated outgoing signal is temperature compensated due to the temperature proportional current signal.

14. The system of claim 13, wherein the band gap current signal comprises a current signal that is not temperature dependent.

15. The system of claim 13, wherein voltage control device comprises a PFET.

16. The system of claim 13, further comprising an input configured to receive a data signal, wherein the data signal and the offset signal generate the control signal such that the control signal is temperature compensated.

17. The system of claim 13, wherein the network comprises one or more resistors.

18. The system of claim 13, wherein the amplitude modulation signal is combined with an output of an RF amplifier to generate the amplitude modulated outgoing signal.

19. The system of claim 13, wherein the system is configured within a mobile communication device.

* * * * *